United States Patent
Yang

(10) Patent No.: US 8,577,063 B2
(45) Date of Patent: Nov. 5, 2013

(54) PACKAGES AND METHODS FOR PACKAGING MEMS MICROPHONE DEVICES

(75) Inventor: Jicheng Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 284 days.

(21) Appl. No.: 13/027,737

(22) Filed: Feb. 15, 2011

(65) Prior Publication Data

US 2011/0198714 A1 Aug. 18, 2011

Related U.S. Application Data

(60) Provisional application No. 61/305,874, filed on Feb. 18, 2010.

(51) Int. Cl.
*H04R 25/00* (2006.01)
*H04R 9/08* (2006.01)

(52) U.S. Cl.
USPC .......................................... 381/175; 381/369

(58) Field of Classification Search
USPC .......................................... 381/175, 355, 369
See application file for complete search history.

(56) References Cited

U.S. PATENT DOCUMENTS

| | | | |
|---|---|---|---|
| 5,870,482 A | 2/1999 | Loeppert et al. | |
| 7,242,089 B2 * | 7/2007 | Minervini | 381/355 |
| 8,199,939 B2 * | 6/2012 | Suvanto et al. | 381/175 |
| 2007/0071268 A1 | 3/2007 | Harney et al. | |
| 2007/0202627 A1 | 8/2007 | Minervini | |
| 2007/0278601 A1 | 12/2007 | Goodelle et al. | |
| 2008/0175425 A1 | 7/2008 | Roberts et al. | |
| 2008/0217766 A1 | 9/2008 | Minervini | |
| 2008/0304681 A1 | 12/2008 | Langlois et al. | |
| 2009/0202089 A1 | 8/2009 | Zhang et al. | |
| 2010/0080405 A1 | 4/2010 | Wu et al. | |
| 2010/0086146 A1 * | 4/2010 | Gong et al. | 381/91 |
| 2010/0142744 A1 * | 6/2010 | Rombach et al. | 381/355 |
| 2012/0237073 A1 | 9/2012 | Goida et al. | |

FOREIGN PATENT DOCUMENTS

| | | |
|---|---|---|
| JP | 2011-120097 | 6/2011 |
| WO | WO 2007/129787 | * 11/2007 |
| WO | WO 2010/116324 | 10/2010 |
| WO | WO 2011/103720 A1 | 9/2011 |

* cited by examiner

*Primary Examiner* — Brian Ensey
(74) *Attorney, Agent, or Firm* — Knobbe Martens Olson & Bear LLP

(57) ABSTRACT

Microelectromechanical systems (MEMS) microphone devices and methods for packaging the same include a package housing, an interior lid, and an integrated MEMS microphone die. The package housing includes a sound port therethrough for communicating sound from outside the package housing to an interior of the package housing. The interior lid is mounted to an interior surface of the package housing to define an interior lid cavity, and includes a back volume port therethrough. The MEMS microphone die is mounted on the interior lid over the back volume port, and includes a movable membrane. The back volume port is configured to allow the interior lid cavity and the MEMS movable membrane to communicate, thereby increasing the back volume of the MEMS microphone die and enhancing the sound performance of the packaged MEMS microphone device.

21 Claims, 3 Drawing Sheets

PACKAGES AND METHODS FOR PACKAGING MEMS MICROPHONE DEVICES

CROSS-REFERENCE TO RELATED APPLICATIONS

The present application claims priority to U.S. Provisional Patent Application No. 61/305,874, filed Feb. 18, 2010, titled "PACKAGES AND METHODS FOR PACKAGING MEMS MICROPHONE DEVICES," the entirety of which is hereby incorporated herein by reference.

BACKGROUND

1. Field

Embodiments of the invention relate to microelectromechanical systems (MEMS) microphone devices and methods for packaging the same.

2. Description of the Related Technology

MEMS microphone dies are often secured within a package for environmental protection, for acoustic back volume and to aid in connecting the die to a larger circuit. The package can include a package lid mounted to a package substrate, and an aperture can be formed through some portion of the package to allow audio signals to reach the microphone.

It can be important for a back volume of a MEMS microphone die to be relatively large. For example, microphone sensitivity of the die can be improved by increasing the back volume. There is a need for improved packaging of integrated microphone devices, including packages with increased acoustic back volume.

SUMMARY

In one embodiment, a packaged integrated microphone device comprises a package housing, an interior lid, and an integrated MEMS microphone die. The package housing includes a sound port therethrough, wherein the sound port communicates sound from outside the package housing to an interior of the package housing. The interior lid is mounted to an interior surface of the package housing to define an interior lid cavity, wherein the interior lid includes a back volume port therethrough. The integrated MEMS microphone die is mounted on the interior lid over the back volume port. The MEMS microphone die includes a movable membrane, wherein the movable membrane is configured to receive sound from outside the package housing through the sound port. The back volume port is configured to allow the interior lid cavity to communicate with the movable membrane.

In another embodiment, a method of making a packaged integrated microphone device is provided. The method includes mounting an interior lid to a surface of a package substrate to define an interior lid cavity, the interior lid including a back volume port therethrough. The method further includes mounting an integrated microelectromechanical systems (MEMS) microphone die over the back volume port, the MEMS microphone die including a movable membrane in communication with the interior lid cavity. The method further includes mounting an exterior lid to the surface of the package substrate to define a package interior, the interior lid disposed within the package interior.

In another embodiment, a packaged integrated microphone device includes a package housing, an interior lid within the package housing, and an integrated microelectromechanical systems (MEMS) microphone die mounted over a back volume port of the interior lid. The package housing includes a sound port therethrough, and the sound port communicates sound from outside the package housing to an interior of the package housing. The interior lid includes a back volume port in communication with an expanded back volume. The MEMS microphone die includes a movable membrane configured to receive sound from outside the package housing through the sound port. The back volume port is configured to allow the movable membrane to communicate with the expanded back volume.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION OF EMBODIMENTS

Packaged MEMS microphone devices and methods of packaging the same will be described while referring to the accompanying drawings. The drawings are schematic and not to scale.

Packaged MEMS Microphone Devices

It can be desirable to enhance sound performance of a packaged MEMS microphone device by increasing the back volume of a MEMS microphone die housed within the packaged device. The back volume of the MEMS microphone die can be configured to act as a pressure reference for the movable membrane of the MEMS microphone die. By increasing the back volume, microphone sensitivity can be improved.

There is a need for increasing the back volume of a MEMS microphone die. Moreover, there is a need for increasing the back volume of a MEMS microphone die in a cost-effective manner and in a way having minimal impact on the dimensions of the packaged MEMS microphone device.

Figure 1:
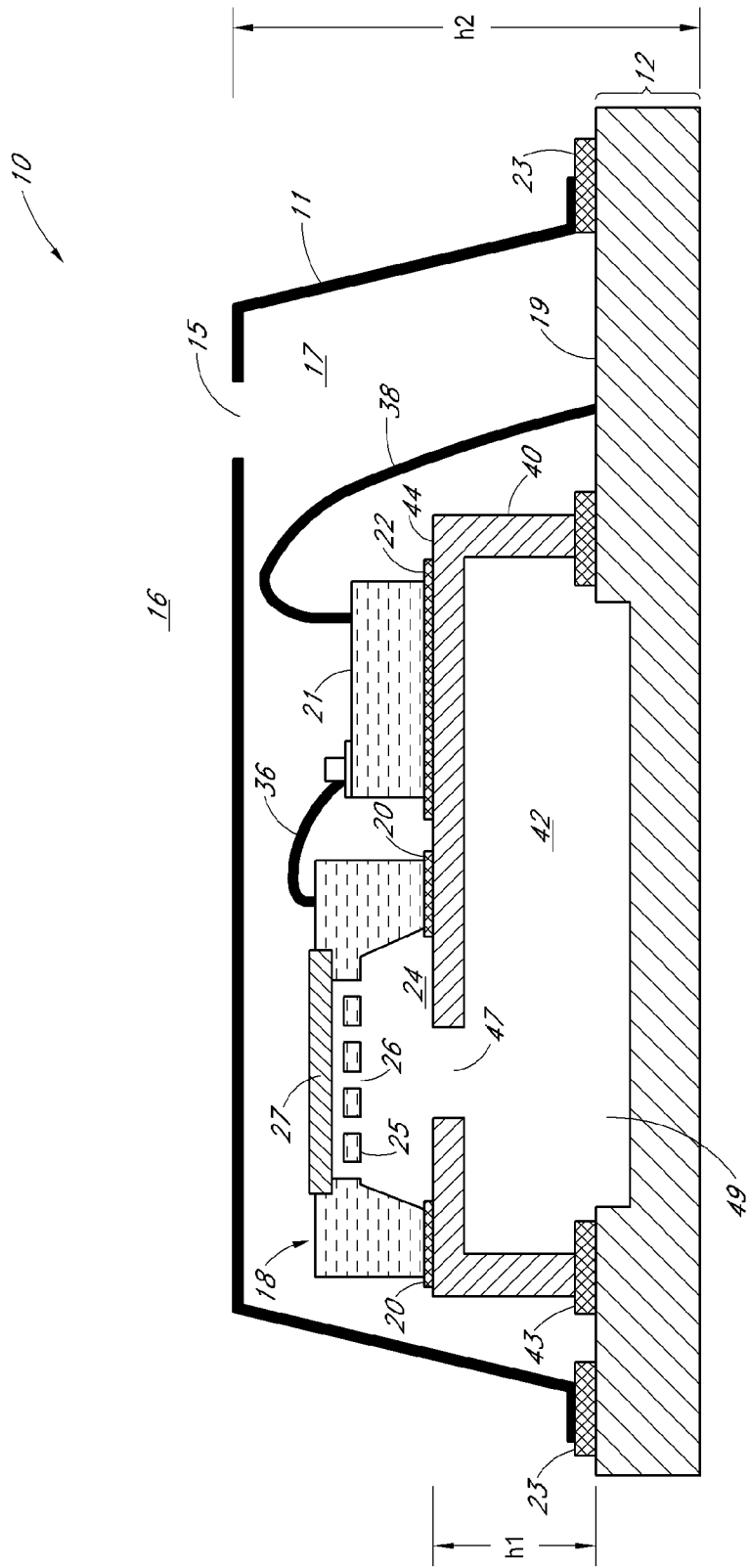
FIG. 1 is a cross-sectional view of a packaged MEMS microphone device according to one embodiment.

FIG. 1 is a cross-sectional view of a packaged MEMS microphone device or package 10 according to one embodiment. The package 10 comprises an exterior package lid 11 and a package substrate 12, collectively referred to as the package housing. The package 10 further comprises a MEMS microphone die 18, an integrated circuit die 21, and an interior lid 40.

The package substrate 12 can be configured to electrically connect the package 10 to a printed circuit board or other larger electrical apparatus or system. The package substrate 12 can include, for example, one or more contacts and/or power or ground leads (not shown in FIG. 1). For example, the package substrate 12 can include a ground lead for serving as a reference voltage to ground the package lid 11. The package substrate 12 can be formed from a variety of materials, including, for example, a ceramic package material or a printed circuit board (PCB) material (e.g., a prepreg, such as FR-4 board, and a metal, such as copper), or pre-molded plastic with leadframes.

The exterior package lid 11 can be formed using one or more materials, including metal or a polymer such as a plastic. For applications in which it is desirable for the exterior package lid 11 to provide radio frequency (RF) shielding and/or to transmit electrical signals, the exterior package lid 11 can be formed of metal, or can be formed of ceramic or plastic with a conductive layer.

The illustrated package 10 also includes an exterior lid adhesive 23 for bonding the exterior package lid 11 to a top face or interior surface 19 of the package substrate 12 to define a package interior 17 therebetween. The exterior lid adhesive 23 can be, for example, solder or an epoxy. The exterior lid adhesive 23 can be conductive and can be configured to electrically connect the exterior package lid 11 to traces (e.g., grounded) on the package substrate 12, thereby aiding in mitigating the potential impact of electromagnetic interference and/or reducing static charge build-up in the exterior package lid 11.

The illustrated exterior package lid 11 includes a sound port 15 therethrough. The sound port 15 can be configured to allow ingress of audio signals from a package exterior 16 to the package interior 17. Once the audio signals enter the package interior 17, the audio signals can reach the MEMS microphone die 18, as will be described in further detail below. The sound port 15 can be formed by any suitable methods, such as by drilling, etching or the use of a laser. The sound port 15 can have any of a variety of widths depending on many factors, including the size and sensitivity of the microphone die being used. In one implementation, the sound port 15 has a width ranging between about 0.1 mm to about 1.0 mm, more particularly about 0.2 mm to about 0.5 mm. The sound port 15 is shown as being offset from the interior lid 40; however, in other arrangements the sound port 15 can be located in other positions, including positions on the sides of the exterior package lid 11 or aligned with the MEMS microphone die 18, or on the package substrate 12 offset from the interior lid 40.

As shown in FIG. 1, the illustrated interior lid 40 is attached to the package substrate 12 to define an interior lid cavity 42. The interior lid 40 can be formed from, for example, metal or plastic or silicon with sufficient structural rigidity to support the chips or dies 18, 21 and wirebonding processes performed on them. The interior lid 40 can also be configured to provide RF shielding in a manner similar to that described above with reference to the exterior package lid 11. The illustrated interior lid 40 is attached to the package substrate 12 using an interior lid adhesive 43 on the top face or first surface 19 of the package substrate 12. The interior lid adhesive 43 can comprise, for example, solder or a conductive or nonconductive epoxy. The interior lid adhesive 43 can be configured to create an acoustic seal to prevent the ingress or egress of audio signals from the interior lid cavity 42 to the package interior 17. In one embodiment, the interior lid adhesive 43 is configured to provide electrically connectivity between the interior lid 40 and the package substrate 12 for grounding.

The illustrated interior lid 40 includes a back volume port 47 through a top face 44 of the interior lid 40. Additional details of the back volume port 47 will be described further below.

One or more components can be mounted on the interior lid 40. For example, as shown in FIG. 1, the integrated MEMS microphone die 18 can be mounted to the top face 44 of the interior lid 40 over the back volume port 47 using a microphone die adhesive 20. The microphone die adhesive 20 can be configured to acoustically seal the MEMS microphone die 18 over the back volume port 47. Furthermore, the integrated circuit die 21 can be mounted to the top face 44 of the interior lid 40, as shown, or mounted on the top face of the package substrate, using an integrated circuit die adhesive 22. The microphone die adhesive 20 and the integrated circuit die adhesive 22 can be, for example, solder or an epoxy. The microphone die adhesive 20 and the integrated circuit die adhesive 22 can be configured to electrically connect one or more portions of the MEMS microphones die 18 and integrated circuit die 21 to the interior lid 40 for grounding.

The integrated circuit die 21 can be used to process data from the MEMS microphone die 18, and can be an application specific integrated circuit (ASIC). In the embodiment illustrated in FIG. 1, microphone die leads 36 connect to the integrated circuit die 21, thereby allowing the integrated circuit die 21 to process electrical signals received from and/or sent to the MEMS microphone die 18. The integrated circuit die 21 can communicate with the package substrate 12 using integrated circuit die leads 38. For example, the integrated circuit die leads 38 can be configured to electrically connect the integrated circuit die 21 to traces (not shown in FIG. 1) on the package substrate 12, thereby permitting communication with external circuitry (e.g. a mobile phone device). Although the integrated circuit die 21 is illustrated as mounted on the interior lid 40 using the integrated circuit die adhesive 22, in certain implementations, the integrated circuit die 21 can be connected and wire bonded in other ways. For example, solder bumps or balls could be deposited onto chip pads on the top side of the integrated circuit die 21, and after flipping the die upside down and aligning the chip pads to matching pads on the package substrate 12, the solder could be flowed so at to interconnect the die and the package substrate.

With continuing reference to FIG. 1, the illustrated MEMS microphone die 18 includes a die cavity 24, a movable membrane 27, and a backplate 25. During operation of the microphone, audio signals can reach a first side of the movable membrane 27, and the movable membrane 27 can be deflected by a pressure difference between the first, and a second, opposing side of the membrane. The backplate 25 can be fixed and can be separated from the movable membrane 27 by a gap, and therefore can serve in conjunction with the movable membrane 27 to form electrodes of a variable capacitor that can be configured to detect audio signals. For example, audio signals can cause the movable membrane 27 to vibrate relative to the fixed backplate 25, thereby producing a changing capacitance. The backplate 25 includes backplate apertures 26, which allow the second side of the membrane 27 to communicate with an acoustically sealed cavity (hereinafter "back volume") that includes both the die cavity 24 and the interior lid cavity 42. Thus, the MEMS microphone die 18 is mounted and acoustically sealed to the interior lid 40 such that the MEMS movable membrane 27 is positioned between and acoustically separates the package sound port 15 and the back volume port 47. The back volume can serve as a pressure reference for the MEMS microphone die 18.

The MEMS microphone die 18 can be fabricated from a silicon or silicon-on-insulator (SOI) wafer, with a die thickness typical of integrated MEMS devices, e.g., about 300-400 µm. The backplate 25 can have a thickness suitable for integration within an integrated MEMS device. The backplate 25 can be provided with the apertures 26 having a number, density, and size that permits air movement sufficient to not inhibit the membrane 27 during operation. Although reference has been made to certain dimensions for the components of the MEMS microphone die 18, persons of ordinary skill in the art will recognize that many other choices are appropriate.

Persons of ordinary skill in the art will appreciate that increasing the back volume can improve sound performance of the packaged MEMS microphone device 10. By selecting the size of the back volume, desired MEMS microphone device performance for a given application can be achieved. Use of the interior lid 40 frees the package from constraints on back volume set by the width of the MEMS microphone device 10 in existing designs, thereby affording much greater flexibility in provision of sufficient back volume.

As described above, the interior lid 40 can be attached to the package substrate 12 to define an interior lid cavity 42, which can be acoustically sealed from the package interior 17. Moreover, the MEMS microphone die 18 can be mounted over the back volume port 47, and the die cavity 24 can be acoustically sealed from the package interior 17 by the microphone die adhesive 20. Thus, the back volume port 47 can be configured to place the die cavity 24 and the interior lid cavity 42 in communication, thereby expanding the back volume of the MEMS microphone die 18 by a volume equal to about the volume of the interior lid cavity 42. Thus, the geometry of the interior lid 40 can be configured so as to provide the desired amount of back volume for the MEMS microphone die 18. The back volume port 47 can be formed by a variety of methods, including, for example, drilling, etching or the use of a laser. The width of the back volume port 47 can be selected from a variety of widths based on a multitude of factors, including, for example, the size of the microphone die being used.

The dimensions of the interior lid 40 can be selected to have a relatively small impact on the dimensions of the package 10. In one embodiment, the height h1 of the interior lid 40 is selected from a range of about 0.15 mm to about 0.25 mm and the height h2 of the whole package 10 is selected from a range of about 1.0 mm to about 1.3 mm. The use of the interior lid 40 can have a significant impact on the increase in back volume. For example, the interior lid 40 can be configured to have a width exceeding the width of the MEMS microphone die 18.

In one embodiment, the package substrate 12 includes a recess 49 configured to further expand the back volume of the MEMS microphone die 18. By including the recess 49, the height of the interior lid 43 can be decreased for a given back volume size. The recess 49 can be formed, for example, by drilling or etching one or more layers of the package substrate 12. In one embodiment, the recess has a depth into the substrate ranging between about 0.05 mm and about 0.5 mm.

Placing the interior lid 40 over the recess 49 can be a more effective way of increasing back volume as compared to placing the MEMS microphone die 18 directly over a recess formed in the package substrate 12. For example, the interior lid 40 can be configured to have a width greater than a width of the MEMS microphone die 18, thereby allowing the MEMS microphone die 18 to be positioned over a recess in the package substrate 12 having a width greater than the width of the MEMS microphone die 18. Thus, the interior lid 40 can aid in increasing back volume even in an embodiment where the interior lid 40 is merely a plate placed flat against the package substrate 12, as illustrated and discussed below with respect to FIG. 3. Furthermore, the embodiment illustrated in FIG. 1 can be cost-effective and simple as compared to other approaches for increasing back volume.

Figure 2:
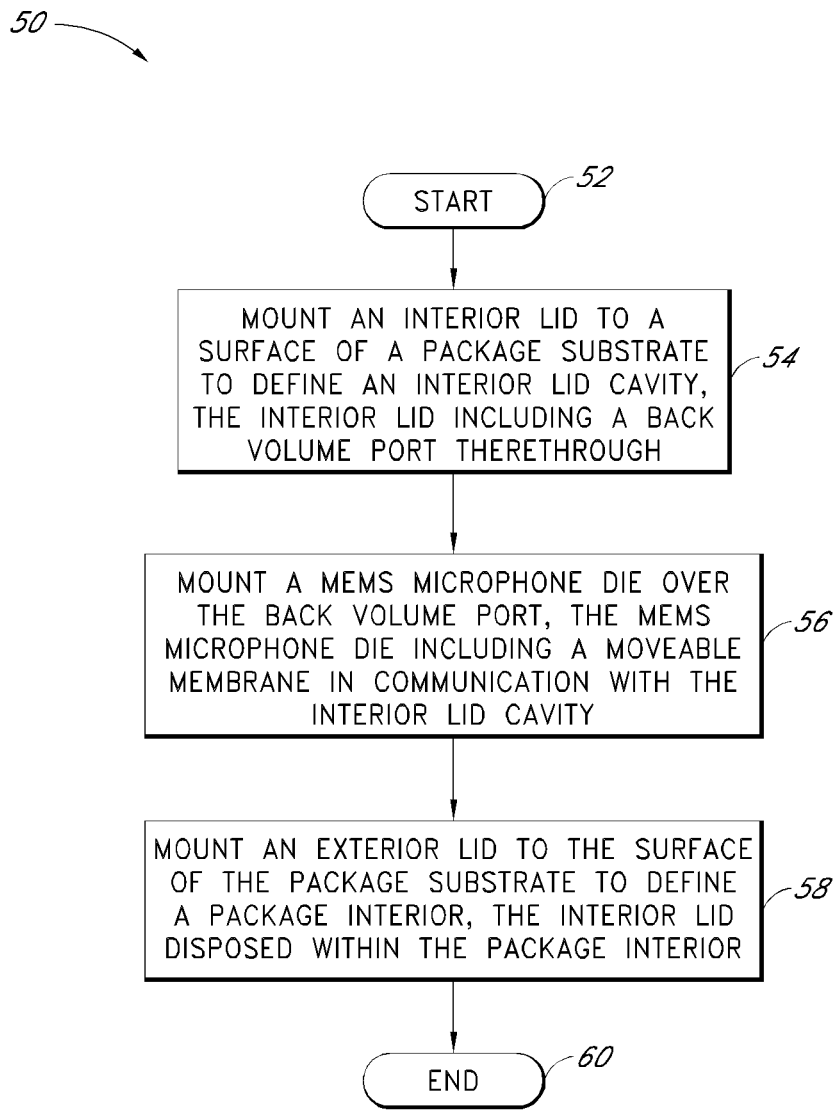
FIG. 2 illustrates one embodiment of a manufacturing process for a packaged MEMS microphone device.

FIG. 2 illustrates one embodiment of a manufacturing process for a packaged MEMS microphone device, such as the packaged MEMS microphone device of FIG. 1. In certain implementations, the order of the blocks can be changed and more or fewer blocks can be performed.

The method 50 starts at block 52. In an ensuing block 54, an interior lid is mounted to a surface of a package substrate to define an interior lid cavity. The interior lid can include a back volume port formed using any suitable technique, such as drilling. The back volume port can be formed either before or after the interior lid is mounted to the surface of the package substrate. The interior lid can be mounted to the package substrate using a wide variety of materials, including, for example, solders and/or epoxies.

The package substrate can be a multi-layer substrate, such as a printed circuit board (PCB). In one implementation, the multi-layer substrate includes alternating conductive and insulative layers, and the layer defining the top face of the package substrate is a conductive layer.

One or more steps can be performed before mounting the interior lid to the surface of the package substrate. For example, the substrate can be subjected to one or more prior preparation steps such as, for example, a cleaning step to aid in mounting the interior lid to the package substrate. Additionally, in some implementations, a recess is formed in the package substrate, and the interior lid is mounted and sealed over the recess to aid in increasing the volume of the interior lid cavity.

The method 50 of FIG. 2 continues at a block 56, in which a MEMS microphone die having a movable membrane is mounted over the back volume port such that the movable membrane is in acoustical communication with the interior lid cavity. The MEMS microphone die can be mounted over the back volume port using, for example, an adhesive or an epoxy, and can be mounted so as to create an acoustic seal for preventing the ingress or egress of audio signals from the interior lid cavity.

One or more die can be mounted to the interior lid and/or to the package substrate before or after mounting the MEMS microphone die. For example, an integrated circuit die can be mounted to the interior lid adjacent the MEMS microphone die. To aid in providing electrical connections, one or more wire bonds can be provided after mounting the die. For example, wire bonds can be provided between die, from a die to the substrate, and/or from a die to traces on the interior lid.

In an ensuing block 58, an exterior lid is mounted to the surface of the package substrate to define a package interior. The exterior lid is mounted over the interior lid such that the interior lid is disposed within the package interior. The package lid can be mounted to the package substrate in any suitable way, such as by using a solder or a conductive or non-conductive epoxy. The exterior lid can include a sound port for communicating sound into and out of the package interior. The sound port can be formed before or after attaching the package lid to the package substrate. In certain implementations, a sound port is omitted from the package lid in favor of employing a sound port formed through the package substrate. The illustrated method 50 ends at 60, but could continue with any suitable step, such as connection the package to a larger circuit, e.g., via a mother board.

Figure 3:
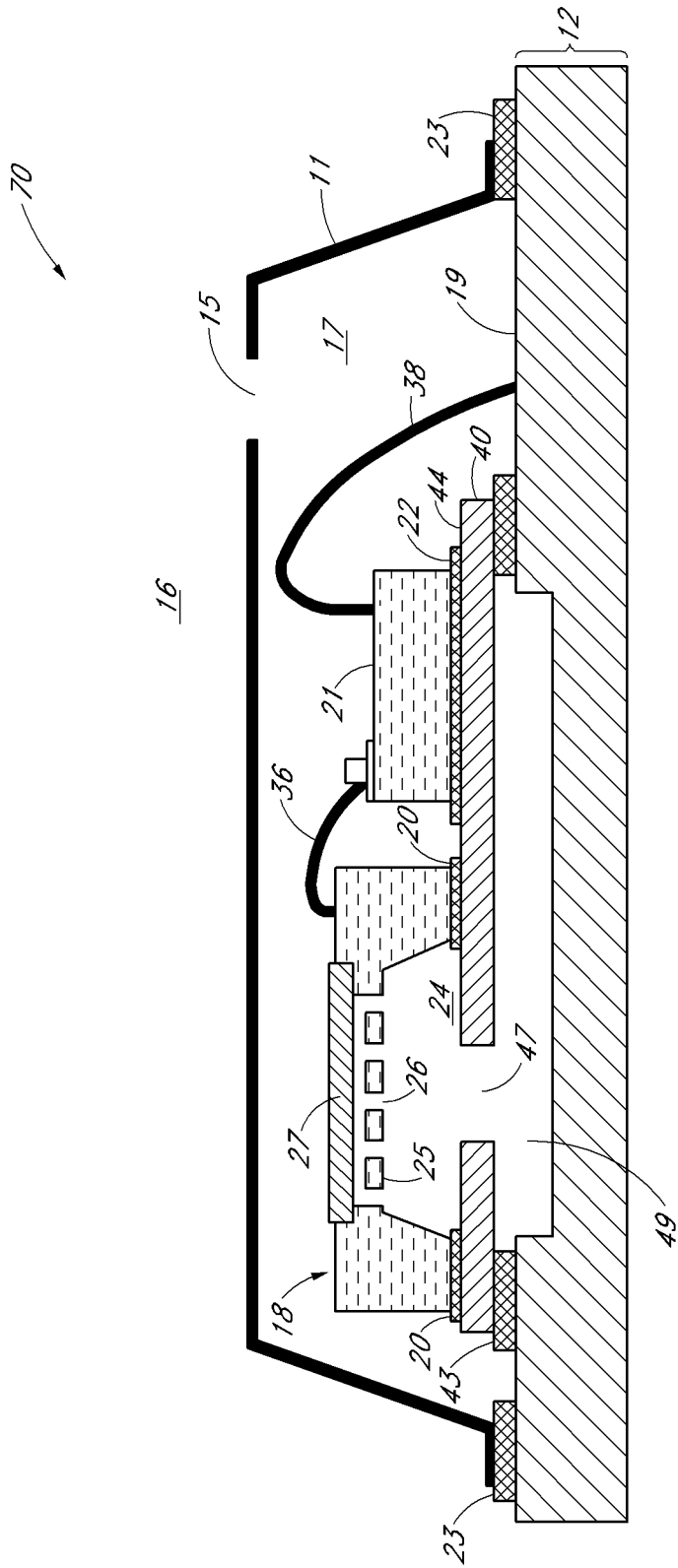
FIG. 3 is a cross-sectional view of a packaged MEMS microphone device according to another embodiment.

FIG. 3 is a cross-sectional view of a packaged MEMS microphone device or package 70 according to another embodiment. The package 70 includes the exterior package lid 11, the exterior lid adhesive 23, the MEMS microphone die 18, microphone die adhesive 20, the microphone die leads 36, the integrated circuit die 21, integrated circuit die adhesive 22, the integrated circuit die leads 38, the interior lid 40, the interior lid adhesive 43, and the package substrate 12, which includes the recess 49. Certain details of the package 70 can be similar to the package 10 of FIG. 1. However, in contrast to the package 10 of FIG. 1, the package 70 of FIG. 3 employs a flat plate as the interior lid 40.

As illustrated in FIG. 3, even when the interior lid 40 is a plate placed flat against the package substrate 12, the interior lid 40 can aid in enhancing the sound performance of the MEMS microphone die and/or reduce the size of the package 70. For example, the MEMS microphone die 18 has been mounted and sealed over the back volume port 47 of the interior lid 40, thereby allowing the MEMS microphone die 18 to communicate with an expanded back volume defined in large part by the recess 49. Rather than the entire interior volume 42 defined by the stand-off construction of FIG. 1, the expanded back volume of FIG. 3 is mostly defined by the recess itself, with additionally volume added by the thickness of interior lid adhesive and the volume of the back volume port 47 itself. The recess 49 can have a width greater than that of the MEMS microphone die 18, and can increase the back volume significantly even in implementations in which the depth of the recess 49 into the package substrate 12 is relatively shallow.

Applications

Devices employing the above described schemes can be implemented into various electronic devices. Examples of the electronic devices can include, but are not limited to, consumer electronic products, parts of the consumer electronic products, electronic test equipment, etc. Examples of electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A packaged integrated microphone device, comprising:
    a package housing including a package substrate and an exterior lid mounted to a first surface of the package substrate, wherein the exterior lid includes a sound port therethrough, and wherein the sound port communicates sound from outside the package housing to an interior of the package housing;
    an interior lid mounted to an interior surface of the package housing to define an interior lid cavity, wherein the interior lid includes a back volume port therethrough; and
    an integrated microelectromechanical systems (MEMS) microphone die mounted on the interior lid over the back volume port, wherein the MEMS microphone die includes a movable membrane, and wherein the movable membrane is configured to receive sound from outside the package housing through the sound port,
    wherein the back volume port is configured to allow the interior lid cavity to communicate with the movable membrane.

2. The packaged integrated microphone device of claim 1, wherein a combined thickness of the exterior lid and the package substrate is in the range of about 1.0 mm to about 1.3 mm.

3. The packaged integrated microphone device of claim 1, wherein the interior lid is mounted to the first surface of the package substrate.

4. The packaged integrated microphone device of claim 3, wherein the substrate includes a recess on the first surface of the substrate covered by the interior lid, the recess configured to increase a volume of the interior lid cavity.

5. The packaged integrated microphone device of claim 3, further comprising an integrated circuit die mounted on the interior lid adjacent the MEMS microphone die.

6. The packaged integrated microphone device of claim 5, further comprising a first wire bond electrically connected between the MEMS microphone die and the integrated circuit die.

7. The packaged integrated microphone device of claim 6, further comprising a wire bond electrically connecting the integrated circuit die to a portion of the package substrate.

8. The packaged integrated microphone device of claim 3, wherein the interior lid comprises at least one of a metal.

9. The packaged integrated microphone device of claim 3, wherein the interior lid has a height extending away from the first surface of the package substrate in the range of about 0.15 mm to about 0.25 mm.

10. A method of making a packaged integrated microphone device, comprising:
    mounting an interior lid to a surface of a package substrate to define an interior lid cavity, the interior lid including a back volume port therethrough;
    mounting an integrated microelectromechanical systems (MEMS) microphone die over the back volume port, the MEMS microphone die including a movable membrane in communication with the interior lid cavity; and
    mounting an exterior lid to the surface of the package substrate to define a package interior, the exterior lid having a sound port formed therethrough for communicating sound into and out of the package interior, the interior lid disposed within the package interior.

11. The method of claim 10, further comprising forming a recess on the surface of the package substrate.

12. The method of claim 11, wherein mounting the interior lid to a surface of a package substrate to define the interior lid cavity comprises mounting the interior lid over the recess.

13. The method of claim 12, wherein a width of the recess is greater than a width of the MEMS microphone die.

14. The method of claim 10, further comprising forming the sound port in the exterior lid.

15. The method of claim 10, further comprising mounting an integrated circuit die on the interior lid adjacent the MEMS microphone die.

16. The method of claim 15, further comprising connecting a wire bond from the MEMS microphone die to the integrated circuit die.

17. The method of claim 15, further comprising connecting a wire bond from the integrated circuit die to the package substrate.

18. A packaged integrated microphone device, comprising:
a package housing including a package substrate and an exterior lid, wherein the exterior lid includes a sound port therethrough, and wherein the sound port communicates sound from outside the package housing to an interior of the package housing;
an interior lid within the package housing, the interior lid including a back volume port in communication with an expanded back volume; and
an integrated microelectromechanical systems (MEMS) microphone die mounted over a back volume port of the interior lid, wherein the MEMS microphone die includes a movable membrane, and wherein the movable membrane is configured to receive sound from outside the package housing through the sound port, and wherein the back volume port is configured to allow the movable membrane to communicate with the expanded back volume.

19. The packaged integrated microphone device of claim 18, wherein the interior lid is mounted to an interior surface of the package substrate facing the interior of the package housing.

20. The packaged integrated microphone device of claim 19, wherein the package substrate includes a recess on the interior surface of the package substrate covered by the interior lid.

21. The packaged integrated microphone device of claim 20, wherein the interior lid is a flat plate mounted and sealed against the interior surface of the package substrate.

* * * * *